United States Patent
Shang et al.

(10) Patent No.: US 10,026,846 B2
(45) Date of Patent: Jul. 17, 2018

(54) DISPLAY SUBSTRATE AND FABRICATION METHOD THEREOF AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Yuedong Shang, Beijing (CN); Wenbin Yang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/084,948

(22) Filed: Mar. 30, 2016

(65) Prior Publication Data
US 2016/0351644 A1     Dec. 1, 2016

(30) Foreign Application Priority Data
May 28, 2015   (CN) .......................... 2015 1 0284300

(51) Int. Cl.
*H01L 27/32* (2006.01)
*H01L 29/66* (2006.01)
(Continued)

(52) U.S. Cl.
CPC .... *H01L 29/78666* (2013.01); *H01L 27/3246* (2013.01); *H01L 29/42364* (2013.01);
(Continued)

(58) Field of Classification Search
None
See application file for complete search history.

(56) References Cited

U.S. PATENT DOCUMENTS 6,984,848 B2 * 1/2006 Liao .................... H01L 21/2026
                                                      257/52
2001/0001496 A1   5/2001 Yamazaki
(Continued)

FOREIGN PATENT DOCUMENTS

CN       1703123 A     11/2005
CN     102110788 A      6/2011
(Continued)

OTHER PUBLICATIONS

The First Chinese Office Action dated Jun. 28, 2017; Appln. No. 201510284300.1.
(Continued)

*Primary Examiner* — Asok K Sarkar
*Assistant Examiner* — Grant Withers
(74) *Attorney, Agent, or Firm* — Ladas & Parry LLP

(57) ABSTRACT

A display substrate and a fabrication method thereof and a display device. The display substrate includes: a plurality of pixels disposed on a lower substrate; and a pixel defining layer disposed between adjacent pixels of the plurality of pixels, the pixel defining layer contacting with an upper substrate of the plurality of pixels, the pixel defining layer configured for defining each pixel and supporting a gap between the upper substrate and the lower substrate.

18 Claims, 5 Drawing Sheets

(51) Int. Cl.
  *H01L 51/56* (2006.01)
  *H01L 29/786* (2006.01)
  *H01L 29/45* (2006.01)
  *H01L 29/51* (2006.01)
  *H01L 29/423* (2006.01)
  *H01L 51/52* (2006.01)
  *H01L 27/12* (2006.01)

(52) U.S. Cl.
  CPC ............ *H01L 29/45* (2013.01); *H01L 29/513* (2013.01); *H01L 29/518* (2013.01); *H01L 51/525* (2013.01); *H01L 27/124* (2013.01); *H01L 27/1218* (2013.01); *H01L 27/1222* (2013.01); *H01L 27/1248* (2013.01); *H01L 27/1259* (2013.01)

(56) References Cited

U.S. PATENT DOCUMENTS

| | | | |
|---|---|---|---|
| 2005/0218396 A1* | 10/2005 | Tsuchiya | H01L 27/3246 257/13 |
| 2005/0269926 A1 | 12/2005 | Fukuoka et al. | |
| 2008/0111494 A1 | 5/2008 | Kim | |
| 2008/0225190 A1 | 9/2008 | Chen et al. | |
| 2011/0127502 A1 | 6/2011 | Kim | |
| 2012/0112212 A1 | 5/2012 | Kim | |
| 2013/0049003 A1* | 2/2013 | Choi | H01L 51/5246 257/72 |
| 2015/0034932 A1* | 2/2015 | Choi | H01L 27/3258 257/40 |
| 2015/0041772 A1* | 2/2015 | Han | H01L 27/3248 257/40 |
| 2015/0270513 A1 | 9/2015 | Choi et al. | |
| 2016/0005798 A1* | 1/2016 | Akiyama | H01L 51/5012 257/72 |
| 2016/0013251 A1* | 1/2016 | Yoshida | H01L 27/3216 257/40 |
| 2016/0187692 A1* | 6/2016 | Woo | G06F 3/0412 257/72 |
| 2016/0197129 A1* | 7/2016 | Kang | H01L 51/5253 257/40 |
| 2016/0254496 A1 | 9/2016 | Xu et al. | |
| 2016/0315288 A1* | 10/2016 | Seo | H01L 51/5271 |

FOREIGN PATENT DOCUMENTS

| | | |
|---|---|---|
| CN | 102468323 A | 5/2012 |
| CN | 102969456 A | 3/2013 |
| CN | 203707134 A | 7/2014 |
| CN | 104269427 A | 1/2015 |
| WO | 2014/136149 A1 | 9/2014 |

OTHER PUBLICATIONS

The Second Chinese Office Action dated Dec. 11, 2017; Appln. No. 201510284300.1.

\* cited by examiner

DISPLAY SUBSTRATE AND FABRICATION METHOD THEREOF AND DISPLAY DEVICE

TECHNICAL FIELD

Embodiments of the present disclosure relate to a display substrate, a display device and a fabrication method of the display substrate.

BACKGROUND

In the flat panel display technology, an OLED (organic light emitting diode) display has the advantages of lightness and thinness, low-power consumption, high contrast, high color gamut, and capability of achieving flexible display, etc. The OLED display is a developing trend of displays in a next generation. The OLED display includes two approaches including PMOLED (passive mechanical and electrical excitation organic light emitting diode) and AMOLED (active matrix organic light emitting diode), where the AMOLED display approach can be achieved by a structure of combining a LTPS (low temperature polycrystalline silicon) backboard with a FMM Mask (fine metal mask), and it is suitable for a large size panel. For example, a structure manner of combining the LTPS backboard with the FMM Mask can be suitable for the application of the large size panel such as a monitor and a television, etc. At present, the manner of combining the LTPS backboard with the FMM Mask is preliminarily matured, and has achieved mass production.

SUMMARY

Embodiments of the present disclosure provide a display substrate, which includes: a plurality of pixels disposed on a lower substrate; and a pixel defining layer disposed between adjacent pixels of the plurality of pixels, the pixel defining layer contacting with an upper substrate of the plurality of pixels, the pixel defining layer configured for defining each pixel and supporting a gap between the upper substrate and the lower substrate.

Embodiments of the present disclosure further provide a display device, and the display device includes any one of the display substrates described herein.

Embodiments of the present disclosure further provide a fabrication method of a display substrate, and the fabrication method includes: forming a plurality of pixels on a lower substrate; and forming a pixel defining layer that contacts with an upper substrate of the plurality of pixels, the pixel defining layer being disposed between adjacent pixels of the plurality of pixels, the pixel defining layer configured for defining each pixel and supporting a gap between the upper substrate and the lower substrate.

BRIEF DESCRIPTION OF THE DRAWINGS

In order to clearly illustrate the technical solutions of the embodiments of the disclosure or the technical solutions of the existing technology, the drawings used in the embodiments or the existing technology will be briefly described in the following. It is obvious that the described drawings are only related to some embodiments of the disclosure. Those skilled in the art can obtain other drawing(s) according to these drawings without any inventive work.

DESCRIPTION OF THE REFERENCE NUMERALS

1—lower substrate; 2—pixel defining layer; 3—upper substrate; 4—buffer layer; 5—gate insulating layer; 6—gate line; 7—insulation layer; 8—source and drain layer; 9—planarization layer; 10—first electrode; 11—bonding agent; 12—isolation layer; 20—pixel; 40—active layer; 41—first via hole; 42—second via hole; 43—third via hole.

DETAILED DESCRIPTION

The technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
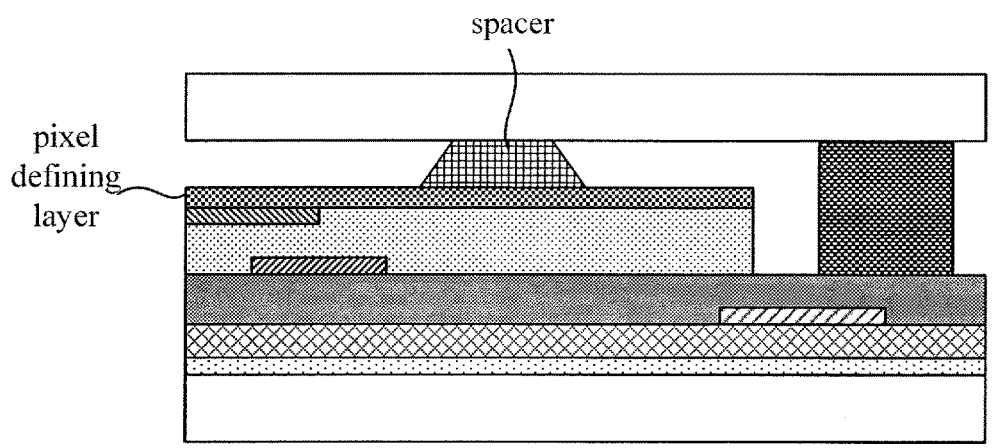
FIG. 1 shows a schematic view of a structure of an exemplary display substrate.
Figure 2:
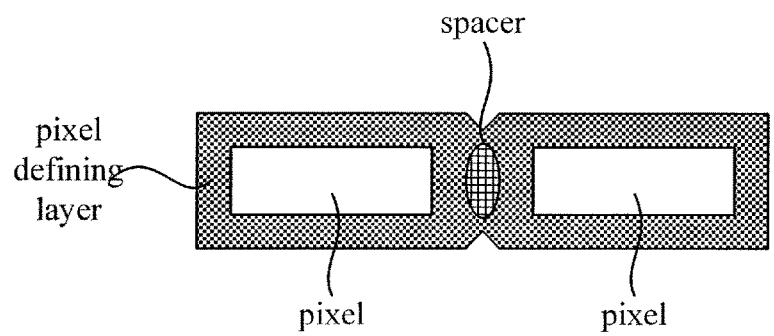
FIG. 2 shows a top view of the display substrate shown in FIG. 1.

In a technical solution shown in FIG. 1, a spacer (PS) and a pixel defining layer (PDL) of a display substrate are usually formed with identical material, but the spacer and the pixel defining layer are manufactured respectively through two mask processes, resulting in a complex manufacturing process. FIG. 2 shows a top view of the display substrate shown in FIG. 1. Different from the technical solution shown in FIG. 1 and FIG. 2, in the technical solutions provided in the embodiments of the disclosure (for example, the technical solutions shown in FIGS. 3A-14), a pixel defining layer can not only define each pixel, but also can give support to a gap between the upper substrate and the lower substrate; that is, the pixel defining layer in FIGS. 3A-14 plays roles equivalent to those of the pixel defining layer and the spacer in the technical solution shown in FIG. 1 and FIG. 2 at the same time. Therefore, the technical solutions provided in the embodiments of the disclosure save a process of manufacturing the spacer and therefore simplify the manufacturing process of the display substrate. For example, in the technical solutions shown in FIG. 3A to FIG. 14, there is no need to provide the spacer shown in FIG. 1 and FIG. 2. Besides, a cross-sectional area of the pixel defining layer in FIG. 3A to FIG. 14 provided by the embodiments of the disclosure is bigger than a cross-sectional area of each spacer in the technical solution shown in FIG. 1 and FIG. 2, and the pixel defining layer in FIG. 3A to FIG. 14 can give better support to the gap between the upper substrate and the lower substrate.

Figure 3A:
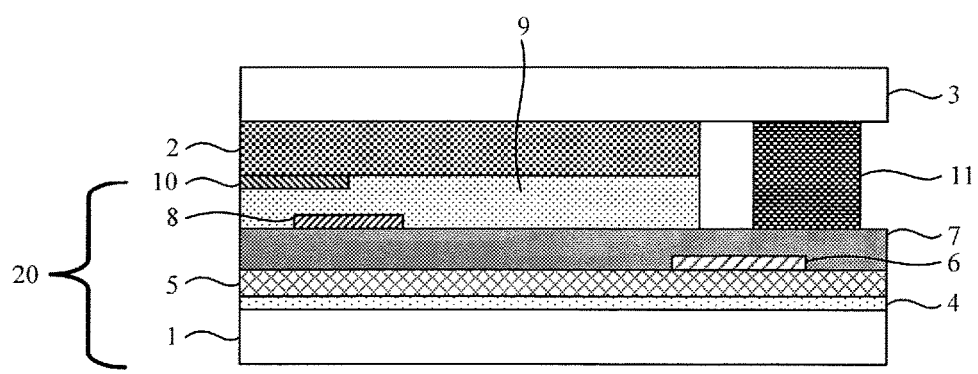
FIG. 3A shows one schematic view of a structure of a display substrate according to an embodiment of the present disclosure.

As shown in FIG. 3A, a display substrate according to an embodiment of the present disclosure includes: a plurality of pixels 20 disposed on a lower substrate 1; and a pixel defining layer 2 disposed between adjacent pixels of the plurality of pixels 20, the pixel defining layer 2 contacting with an upper substrate 3 of the plurality of pixels 20, the pixel defining layer 2 configured for defining each pixel 20 and also for supporting a gap between the upper substrate 3 and the lower substrate 1.

Figure 3B:
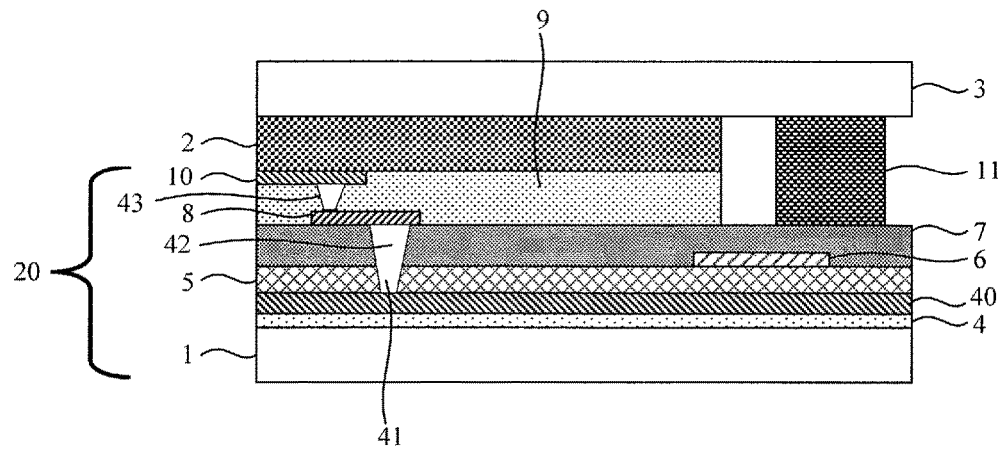
FIG. 3B shows another schematic view of a structure of a display substrate according to an embodiment of the present disclosure.
Figure 4:
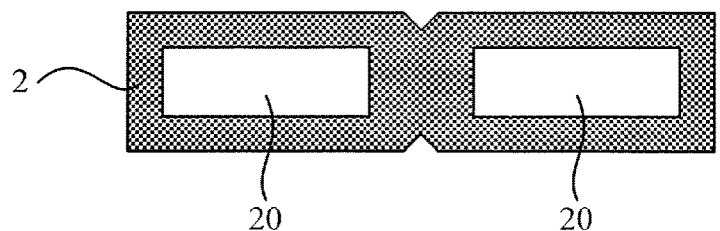
FIG. 4 shows a top view of the display substrates shown in FIG. 3A and FIG. 3B.

Because the pixel defining layer 2 can not only define each pixel 20, but also can support a gap between the upper substrate 3 and the lower substrate 1, which equivalently functions as the pixel defining layer and the spacer in the technical solution shown in FIG. 1 and FIG. 2 at the same time, the technical solutions shown in FIGS. 3A-14 provided by the embodiments of the disclosure can save a process of manufacturing the spacer as shown in FIG. 1 and can simplify the manufacturing process of the display substrate. Furthermore, in the technical solution shown in FIG. 1 and FIG. 2, it is mainly the spacer that supports the gap between the upper substrate and the lower substrate; however, as shown in FIGS. 3A-3B and FIG. 4, in the embodiments of the disclosure it is mainly the pixel defining layer 2 that supports the gap between the upper substrate 3 and the lower substrate 1. Because a cross-sectional area of the pixel defining layer 2 in FIGS. 3A-3B and FIG. 4 (e.g., a cross-sectional area of the pixel defining layer 2 along a plane that is parallel with the lower substrate 1 or the upper substrate 3) is greater than a cross-sectional area of the spacer shown in FIG. 1 (e.g., a cross-sectional area of the space along a plane that is parallel with the lower substrate in FIG. 1), the pixel defining layer 2 can better support the gap between the upper substrate 3 and the lower substrate 1.

For example, a thickness of the pixel defining layer 2 in FIG. 3A can be set to be equal to a sum of a height of the pixel defining layer and a height of the spacer shown in FIGS. 1 and 2. Of course, the thickness of the pixel defining layer 2 can also be adjusted according to actual needs. The upper substrate 3 and the lower substrate 1 can use VAS (vacuum apply system) vacuum involution.

For example, the pixel defining layer 2 is made of polyimide resin.

Polyimide (abbreviation "PI") has good mechanical properties and strong capabilities of compression resistance and tensile resistance. Therefore, the pixel defining layer 2 made of polyimide resin can support the gap between the upper substrate 3 and the lower substrate 1, and can also block light and define the pixels 20.

For example, each pixel 20 includes:

a buffer layer 4 disposed on the lower substrate 1; for example, the buffer layer includes silicon dioxide (SiO2) with a thickness of 3000 A and silicon nitride (SiNx) with a thickness of 2000 A;

an active layer (for example, an active layer 40 shown in FIG. 3B) disposed on the buffer layer 4; for example, the active layer can be made of amorphous silicon, with a thickness of 400 A to 600 A;

a gate insulating layer 5 disposed on the active layer; for example, the gate insulating layer 5 includes SiO2 with a thickness of 800 A and SiNx with a thickness of 400 A;

a gate line 6 disposed on the gate insulating layer 5, where the gate line 6 and a gate electrode connected to the gate line 6 are made of molybdenum (Mo) with a thickness of 2000 A to 3000 A;

an insulation layer 7 disposed on the gate line 6; for example, the insulation layer 7 includes SiO2 with a thickness of 3000 A and SiNx with a thickness of 2000 A;

a source and drain layer 8 disposed on the insulation layer 7;

a planarization layer 9 disposed on the source and drain layer 8; and a first electrode 10 disposed on the planarization layer 9, where the first electrode can be a metal anode. For example, a structure of the first electrode includes a first indium tin oxide layer with a thickness of 70 A, a silver metal layer with a thickness of 1000 A and a second indium tin oxide layer with a thickness of 70 A (i.e., the structure of the first electrode can include ITO/Ag/ITO (70 A/1000 A/70 A) in sequence).

For example, a first via hole (for example, a via hole 41 shown in FIG. 3B) is configured in the gate insulating layer 5, a second via hole (for example, a via hole 42 shown in FIG. 3B) is configured in the insulation layer 7, and the source and drain layer 8 is electrically connected with the active layer through the first via hole and the second via hole.

For example, a third via hole (for example, a via hole 43 shown in FIG. 3B) is configured in the planarization layer 9, and the first electrode 10 is electrically connected with a drain electrode of the source and drain layer 8 through the third via hole.

For example, the source and drain layer 8 includes a first titanium metal layer, an aluminum metal layer and a second titanium metal layer, and the aluminum metal layer is disposed between the first titanium metal layer and the second titanium metal layer. A thicknesses of the first titanium metal layer (Ti), a thickness of the aluminum metal layer (AL) and a thickness of the second titanium metal layer (Ti) are 700 A, 4000 A and 700 A respectively (i.e., the relationship among the thicknesses of the three is Ti/AL/Ti (700 A/4000 A/700 A)).

By sandwiching the aluminum metal layer with two layers of titanium metal, it can guarantee that the source drain electrode 9 has good conductivity and mechanical properties, to ensure normal operation of the driving circuit during operation time of the display substrate.

For example, each pixel 20 further includes:

a bonding agent 11, disposed between the upper substrate 3 and the insulation layer 7 for bonding the upper substrate 3 and the insulation layer 7. The upper substrate 3 and the lower substrate 1 can be firmly bonded through the bonding agent 11.

Figure 5:
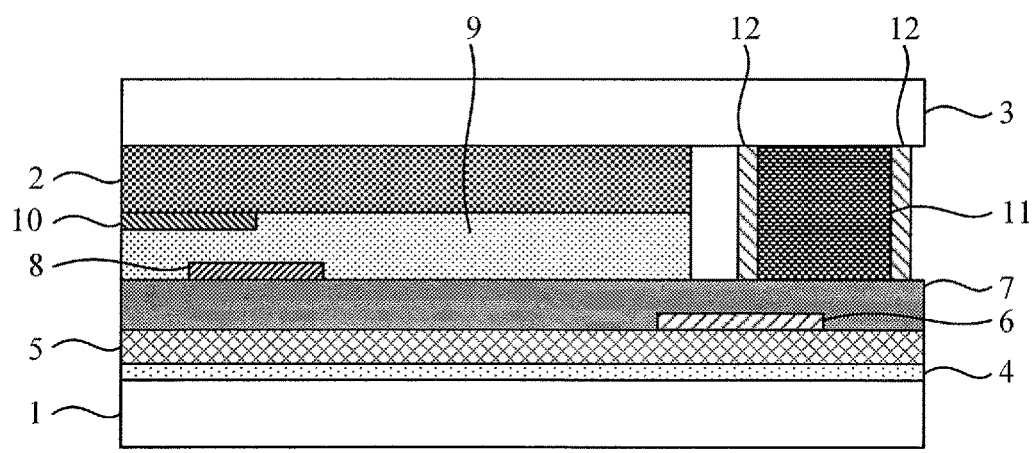
FIG. 5 shows a schematic view of a structure of a display substrate according to another embodiment of the present disclosure.

For example, as shown in FIG. 5, an isolation layer 12 is disposed on both an inner surface and an outer surface of the bonding agent 11. In other examples, an isolation layer 12 can be disposed on an inner surface or an outer surface of the bonding agent 11. The isolation layer 12 can prevent the organic light emitting material within the pixel to be polluted.

It's to be noted that, the display substrate in the embodiments of the disclosure can be a LTPS substrate, and can include a structure of organic light-emitting material or the like. Similar description will not be repeated here.

Figure 6:
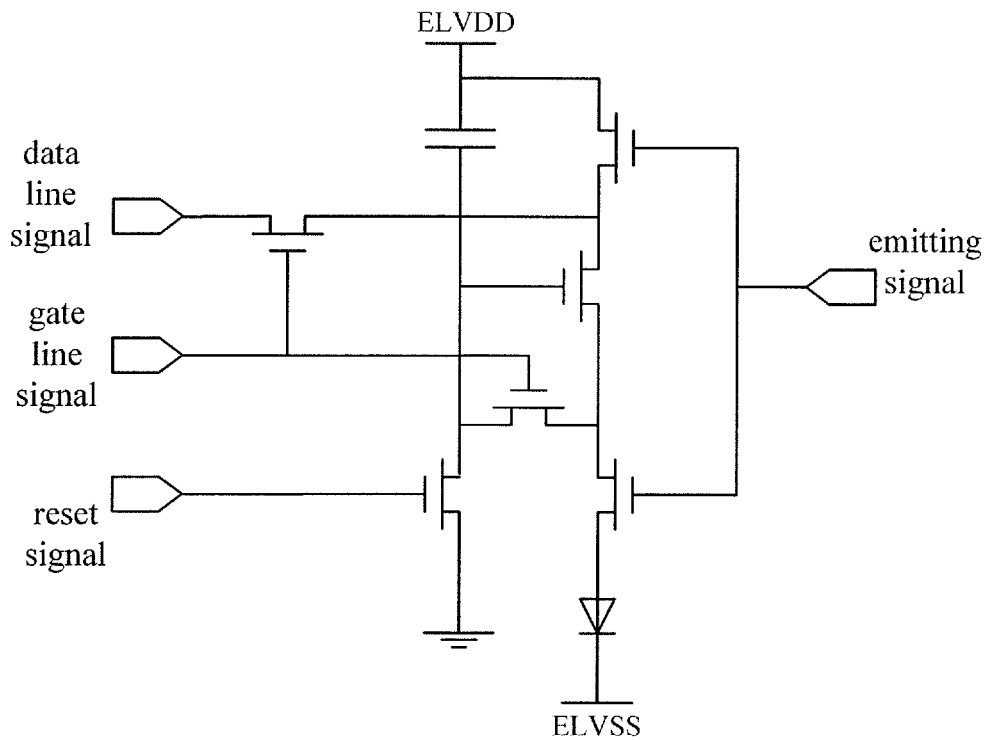
FIG. 6 shows an equivalent circuit diagram of a pixel driving circuit according to an embodiment of the present disclosure.

Besides, the source and drain layer 8 and the first electrode 10 in the embodiments of the disclosure can form a diode structure, and can further form a 6TIC structure with six transistors and a capacitor in the driving circuit of the pixel 20 (an equivalent circuit diagram of the 6T1C structure is shown in FIG. 6), which has a good compensation effect, and can effectively eliminate an impact that the threshold voltage and the mobility of the carriers impose on the stability and uniformity of the driving circuit.

The embodiments of the disclosure further provide a display device, which includes any one of the above-described display substrates.

It's to be noted that, the display device in the embodiments of the disclosure can be: an electronic paper, a mobile phone, a tablet computer, a television, a notebook computer, a digital picture frame, a navigation system or any other product or component having a display function.

Figure 7:
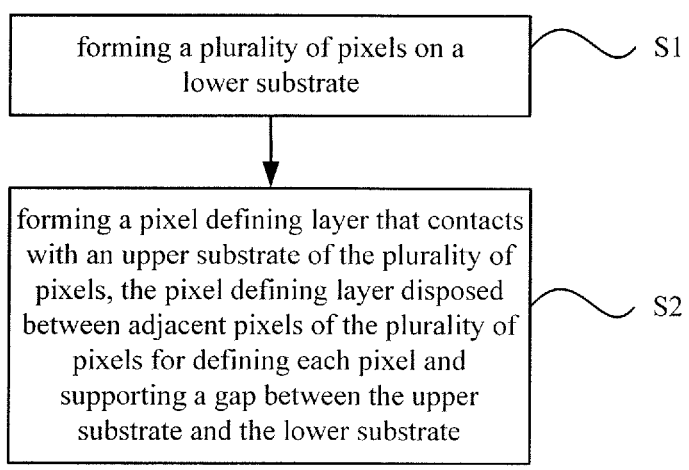
FIG. 7 shows a schematic flow diagram of a fabrication method of a display substrate according to an embodiment of the present disclosure.

As shown in FIG. 7, a fabrication method of the display substrate according to an embodiment of the disclosure, includes:

step S1, forming a plurality of pixels 20 on a lower substrate 1; and step S2, forming a pixel defining layer 2 that contacts with an upper substrate of the plurality of pixels, the pixel defining layer 2 formed between adjacent pixels 20 of the plurality of pixels, the pixel defining layer 2 configured for defining each pixel 20 and supporting a gap between the upper substrate 3 and the lower substrate 1.

For example, the pixel defining layer 2 is made of polyimide resin.

Figure 8:
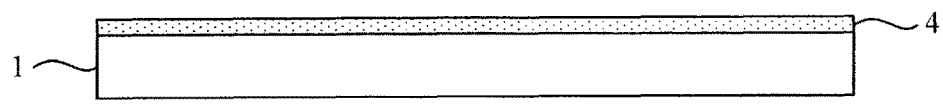
FIGS. 8-14 show a specific schematic flow diagram of forming a display substrate according to an embodiment of the present disclosure.
Figure 9:
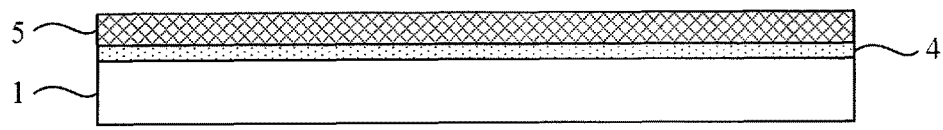
Figure 10:
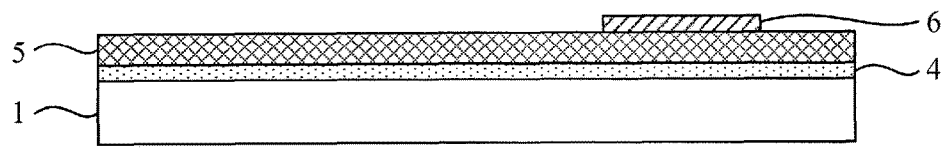
Figure 11:
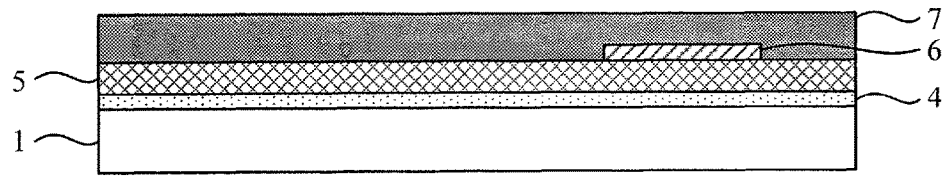
Figure 12:
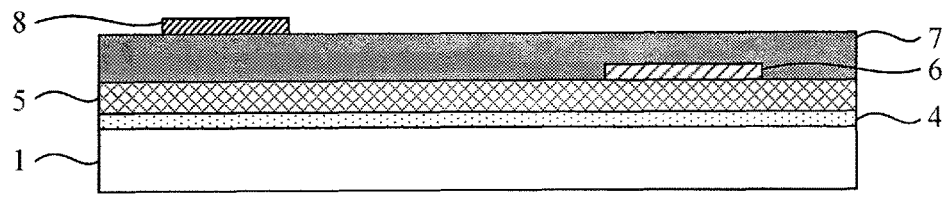
Figure 13:
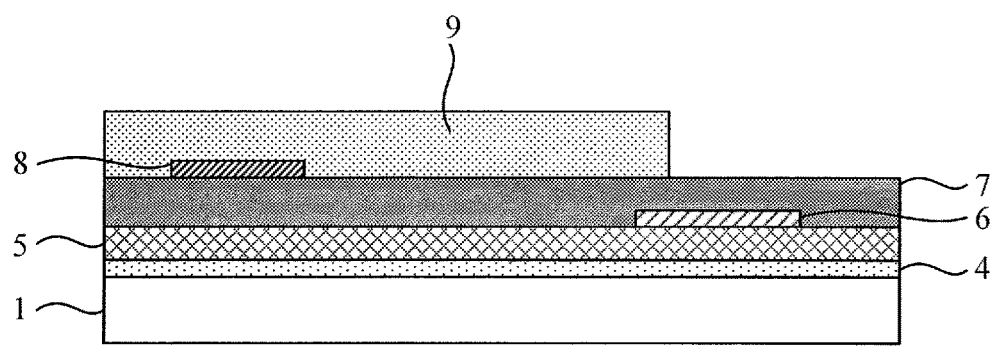
Figure 14:
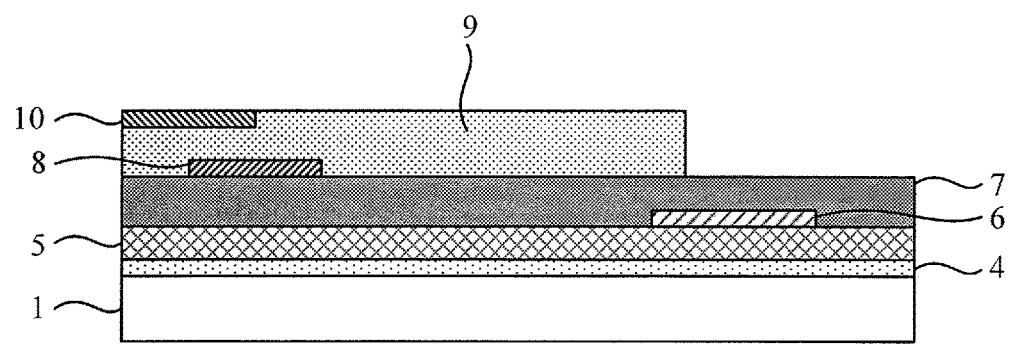

For example, forming a plurality of pixels 20 on the lower substrate 1 includes:

forming a buffer layer 4 on the lower substrate 1, as shown in FIG. 8;

forming an active layer on the buffer layer 4;

forming a gate insulating layer 5 on the active layer, as shown in FIG. 9;

forming a gate line 6 on the gate insulating layer 5, as shown in FIG. 10;

forming an insulation layer 7 on the gate line 6, as shown in FIG. 11;

forming a source and drain layer 8 on the insulation layer 7, as shown in FIG. 12;

forming a planarization layer 9 on the source and drain layer 8, as shown in FIG. 13; and forming a first electrode 10 on the planarization layer 9, as shown in FIG. 14.

For example, forming a plurality of pixels 20 on the lower substrate 1 further includes:

forming a first via hole in the gate insulating layer 5 and forming a second via hole in the insulation layer 7, so that the source and drain layer 8 is electrically connected with the active layer through the first via hole and the second via hole; and forming a third via hole in the planarization layer 9, so that the first electrode 10 is electrically connected with a drain electrode that is disposed in the source and drain layer 8 through the third via hole.

For example, forming the source and drain layer 8 on the insulation layer 7 includes:

forming a first titanium metal layer on the insulation layer 7;

forming an aluminum metal layer on the first titanium metal layer; and forming a second titanium metal layer on the aluminum metal layer.

For example, the fabrication method of the display substrate according to an embodiment of the disclosure further includes:

forming a bonding agent 11 between the upper substrate 3 and the insulation layer 7 for bonding the upper substrate 3 and the insulation layer 7.

For example, the fabrication method of the display substrate according to an embodiment of the disclosure further includes:

forming an isolation layer 12 on an inner surface and/or an outer surface of the bonding agent 11.

For example, the forming operations in the above processes can include: a film-forming process including deposition and sputtering, etc., and a patterning process including etching, etc.

The technical solutions of the disclosure have been described in connection with the drawings. In FIG. 1 and FIG. 2, the pixel defining layer and the spacer are manufactured respectively through two sets of manufacturing processes, and the manufacturing processes are complicated. In the technical solutions shown in FIGS. 3A-14 provided by the embodiments of the present disclosure, a pixel defining layer can not only define each pixel, but also can support a gap between the upper substrate and the lower substrate; that is, functionality of the pixel defining layer shown in FIGS. 3A-14 is equivalent to both the functionality of the pixel defining layer and the functionality of the spacer shown in FIG. 1 and FIG. 2. Therefore, the technical solutions provided by the embodiments of the disclosure save a process of manufacturing the spacer and simplify the manufacturing process. A cross-sectional area of the pixel defining layer shown in FIGS. 3A-14 is bigger than a cross-sectional area of each spacer shown in FIG. 1 and FIG. 2, and therefore the pixel defining layer in FIGS. 3A-14 can better support the gap between the upper substrate and the lower substrate.

It's to be noted that, in the drawings, for the clarity of the drawings the sizes of layers and areas may be exaggerated. And it can be understood, in the case that a component or a layer called "on" another element or layer, it can be directly on the top of the other elements, or can exist in the middle layer. Besides, it can be understood that, in the case that a component or a layer called "under" another element or layer, it can be directly under the other components, or there are at least two intermediate layers or elements. Besides, it can also be understood that, in the case that a layer or a component called "between" two layers or two elements, it can be the only layer of the two layers or two components, or it also exists at least two intermediate layers or elements. The similar reference marks indicate similar components in the whole text.

In the present disclosure, the terms "the first", "the second", "the third" only used to describe the purpose, and can not be understood as instructions or suggestions of relative importance. The term "a plurality of" refers to two or more than two, unless expressly limited.

What are described above is related to the illustrative embodiments of the disclosure only and not limitative to the scope of the disclosure; any changes or replacements easily for those technical personnel who are familiar with this technology in the field to envisage in the scopes of the disclosure, should be in the scope of protection of the present disclosure. Therefore, the scopes of the disclosure are defined by the accompanying claims.

The present application claims the priority of the Chinese Patent Application No. 201510284300.1 filed on May 28, 2015, which is incorporated herein by reference in its entirety as part of the disclosure of the present application.

The invention claimed is:

1. A display substrate, comprising:
a plurality of pixels disposed on a lower substrate; and a pixel defining layer disposed between adjacent pixels of the plurality of pixels, the pixel defining layer directly contacting an upper substrate of the plurality of pixels, the pixel defining layer configured for defining each pixel and giving support between the upper substrate and the lower substrate, wherein each pixel comprises:
a buffer layer disposed on the lower substrate;
an active layer disposed on the buffer layer;
a gate insulating layer disposed on the active layer;
a gate line disposed on the gate insulating layer; and
an insulation layer disposed on the gate line; and wherein the display substrate further comprises:
a bonding agent disposed directly between the upper substrate and the insulation layer; and
an isolation layer disposed on and covering at least one of an inner side surface and an outer side surface of the bonding agent.

2. The display substrate according to claim 1, wherein the pixel defining layer is made of polyimide resin.

3. The display substrate according to claim 1, wherein each pixel further comprises:
a source and drain layer disposed on the insulation layer;
a planarization layer disposed on the source and drain layer; and
a first electrode disposed on the planarization layer.

4. The display substrate according to claim 3, wherein the buffer layer comprises silicon dioxide with a thickness of 3000 A and silicon nitride with a thickness of 2000 A.

5. The display substrate according to claim 3, wherein the active layer comprises amorphous silicon with a thickness of 400 A to 600 A.

6. The display substrate according to claim 3, wherein the gate insulating layer comprises silicon dioxide with a thickness of 800 A and silicon nitride with a thickness of 400 A.

7. The display substrate according to claim 3, wherein the insulation layer comprises silicon dioxide with a thickness of 3000 A and silicon nitride with a thickness of 2000 A.

8. The display substrate according to claim 3, wherein a first via hole is provided in the gate insulating layer, a second via hole is provided in the insulation layer, and the source and drain layer is electrically connected with the active layer through the first via hole and the second via hole;
a third via hole is provided in the planarization layer, and the first electrode is electrically connected with a drain electrode disposed in the source and drain layer through the third via hole.

9. The display substrate according to claim 3, wherein the source and drain layer comprises a first titanium metal layer, an aluminum metal layer and a second titanium metal layer, and the aluminum metal layer is disposed between the first titanium metal layer and the second titanium metal layer.

10. The display substrate according to claim 1,
wherein the bonding agent is configured for bonding the upper substrate and the insulation layer.

11. A display device, comprising the display substrate according to claim 1.

12. The display device according to claim 11, wherein the display device is one of an electronic paper, a mobile phone, a tablet computer, a television, a notebook computer, a digital picture frame, and a navigation system.

13. A fabrication method of a display substrate, comprising:
forming a plurality of pixels on a lower substrate; and
forming a pixel defining layer that directly contacts an upper substrate of the plurality of pixels, the pixel defining layer disposed between adjacent pixels of the plurality of pixels, the pixel defining layer configured for defining each pixel and giving support between the upper substrate and the lower substrate, wherein forming the plurality of pixels on the lower substrate comprises:
forming a buffer layer on the lower substrate;
forming an active layer on the buffer layer;
forming a gate insulating layer on the active layer;
forming a gate line on the gate insulating layer; and
forming an insulation layer on the gate line; and wherein the fabrication method of the display substrate further comprises:
forming a bonding agent directly between the upper substrate and the insulation layer; and
forming an isolation layer on and covering at least one of an inner side surface and an outer side surface of the bonding agent.

14. The fabrication method of the display substrate according to claim 13, wherein the pixel defining layer is made of polyimide resin.

15. The fabrication method of the display substrate according to claim 13, wherein forming the plurality of pixels on the lower substrate comprises:
forming a source and drain layer on the insulation layer;
forming a planarization layer on the source and drain layer; and
forming a first electrode on the planarization layer.

16. The fabrication method of the display substrate according to claim 15, wherein forming the plurality of pixels on the lower substrate further comprises:
forming a first via hole in the gate insulating layer, forming a second via hole in the insulation layer, wherein the source and drain layer is electrically connected with the active layer through the first via hole and the second via hole; and
forming a third via hole in the planarization layer, wherein the first electrode is electrically connected with a drain electrode of the source and drain layer through the third via hole.

17. The fabrication method of the display substrate according to claim 15, wherein forming the source and drain layer on the insulation layer comprises:
forming a first titanium metal layer on the insulation layer;
forming an aluminum metal layer on the first titanium metal layer; and
forming a second titanium metal layer on the aluminum metal layer.

18. The fabrication method of the display substrate according to claim 15,
wherein the bonding agent is configured for bonding the upper substrate and the insulation layer.

* * * * *